US009812221B1

(12) United States Patent
Hagen et al.

(10) Patent No.: US 9,812,221 B1
(45) Date of Patent: Nov. 7, 2017

(54) MULTI-CORE CACHE COHERENCY BUILT-IN TEST

(71) Applicants: John L. Hagen, Marion, IA (US); David J. Radack, Robins, IA (US); Lloyd F. Aquino, Marion, IA (US); Todd E. Miller, Marion, IA (US)

(72) Inventors: John L. Hagen, Marion, IA (US); David J. Radack, Robins, IA (US); Lloyd F. Aquino, Marion, IA (US); Todd E. Miller, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 236 days.

(21) Appl. No.: 14/849,390

(22) Filed: Sep. 9, 2015

(51) Int. Cl.
G06F 12/08 (2016.01)
G11C 29/38 (2006.01)
G11C 29/36 (2006.01)
G06F 12/0891 (2016.01)
G06F 12/0815 (2016.01)

(52) U.S. Cl.
CPC .......... *G11C 29/38* (2013.01); *G06F 12/0815* (2013.01); *G06F 12/0891* (2013.01); *G11C 29/36* (2013.01); *G06F 2212/1032* (2013.01); *G06F 2212/50* (2013.01); *G06F 2212/62* (2013.01); *G06F 2212/682* (2013.01)

(58) Field of Classification Search
CPC ............. G06F 21/44; G06F 2212/1052; G06F 12/0866; G06F 12/0815
See application file for complete search history.

(56) References Cited

U.S. PATENT DOCUMENTS

| 7,991,963 | B2 | 8/2011 | Steiner et al. |
| 9,411,733 | B2* | 8/2016 | Zhao ........................ G06F 12/08 |
| 2009/0217280 | A1 | 8/2009 | Miller et al. |
| 2010/0088472 | A1* | 4/2010 | Ukai .................... G06F 12/0815 711/130 |
| 2012/0084525 | A1 | 4/2012 | Jegu et al. |
| 2013/0254488 | A1* | 9/2013 | Kaxiras ............... G06F 12/0815 711/130 |

* cited by examiner

Primary Examiner — David X Yi
Assistant Examiner — Candice Rankin
(74) Attorney, Agent, or Firm — Angel N. Gerdzhikov; Donna P. Suchy; Daniel M. Barbieri

(57) ABSTRACT

A system and method for verifying cache coherency in a safety-critical avionics processing environment includes a multi-core processor (MCP) having multiple cores, each core having at least an L1 data cache. The MCP may include a shared L2 cache. The MCP may designate one core as primary and the remainder as secondary. The primary core and secondary cores create valid TLB mappings to a data page in system memory and lock L1 cache lines in their data caches. The primary core locks an L2 cache line in the shared cache and updates its locked L1 cache line. When notified of the update, the secondary cores check the test pattern received from the primary core with the updated test pattern in their own L1 cache lines. If the patterns match, the test passes; the MCP may continue the testing process by updating the primary and secondary statuses of each core.

20 Claims, 10 Drawing Sheets

200

205 — Designating, via the MCP, a first processor core of the one or more processor cores as a primary core and at least one second processor core of the one or more processor cores as a secondary core 210 — Generating, via the primary core, at least one first mapping associated with at least one data page of a system memory 215 — Generating, via the at least one secondary core, at least one second mapping associated with the at least one data page 220 — Locking, via the primary core, at least one first cache line of a first cache associated with the primary core, the at least one first cache line associated with the at least one first data page 225 — Locking at least one second cache line of a second cache via the at least one secondary core, the at least one second cache line associated with the at least one first data page and the at least one second cache associated with the at least one secondary core 230 — Locking, via the primary core, at least one third cache line associated with the at least one first data page, the third cache shared by the one or more processor cores

270 — Writing at least one third data pattern to the at least one first cache line via the primary core 275 — Performing at least one second flush of the at least one first cache line via the primary core 280 — Passing at least one of a second update notification and the at least one third data pattern from the primary core to the at least one secondary core via the at least one control page 285 — On receiving the at least one of a second update notification and the at least one third data pattern, reading at least one fourth data pattern from the at least one second cache line via the at least one secondary core 290 — Determining, via the at least one secondary core, at least one of a second test pass and a second test fail by comparing the at least one received third data pattern and the at least one fourth data pattern 295 — Reporting, via the at least one secondary core, the at least one of a second test pass and a second test fail to the primary core 300 — If at least one second test fail is reported to the primary core, logging at least one second fatal fault via the system HM 305 — If no second test fail is reported to the primary core, a) designating the primary core as a secondary core via the MCP and b) designating one secondary core as a primary core

FIG. 3C

310 — Generating, via the primary core, at least one third mapping associated with a second data page of the system memory, the second data page including at least one first memory address and at least one second memory address 315 — Locking at least one fourth cache line of the first cache via the primary core 320 — Locking at least one fifth cache line of the at least one third cache, the at least one fourth cache line and the at least one fifth cache line associated with the at least one first memory address 325 — Writing at least one fifth data pattern to the at least one fourth cache line via the primary core 330 — Performing at least one third flush of the at least one fourth cache line via the primary core 335 — Writing at least one sixth data pattern to the at least one second memory address via the primary core 340 — Replacing the contents of the at least one first memory address with the contents of the at least one second memory address via at least one peripheral device 345 — Reading the contents of the at least one first memory address via the primary core 350 — Determining, via the primary core, at least one of a third test pass and a third test fail by comparing the contents of the at least one first memory address and the at least one sixth data pattern

MULTI-CORE CACHE COHERENCY BUILT-IN TEST

BACKGROUND

The use of multi-core processors, including multi-core cache architecture and cache coherency mechanism, presents new problems when deployed in a safety-critical avionics environment. It may be desirable to provide a means for verifying proper operation of the hardware-based cache coherency mechanism in a safety-critical environment.

SUMMARY

In one aspect, embodiments of the inventive concepts disclosed herein are directed to a processor system including a multi-core processor (MCP) having one or more processor cores, each processor core including a Level 1 (L1 data cache). A Level 2 (L2) cache may be shared by all processor cores. The MCP may designate a processor core as a primary core and the remaining processor cores as secondary cores. The MCP may include one or more memory addresses, including physical addresses mapped to the system memory (ex.—system RAM). The system memory may include data pages and control pages, each data page and control page including one or more physical addresses. The current primary core may generate a first translation lookaside buffer (TLB) mapping to a data page and lock a data cache line in its L1 data cache and a second cache line in the L2 shared cache.

The primary core may update its locked L1 cache line by writing a first data pattern to the L1 cache line (which will automatically update the locked L2 cache line) and perform a data cache flush to push the first data pattern from the locked L2 cache line out to system memory. The primary core may pass a first update notification and the first data pattern to the secondary cores via a control page. The secondary cores may each generate a second TLB mapping to the data page and lock a data cache line in their individual L1 caches. When the first update notification is received from the primary core, the secondary cores may read a second pattern from their locked L1 cache line (which will be loaded through the L2 cache line with the contents of the first data page in system memory). The secondary cores may compare the second pattern read from its locked L1 cache line with the first pattern received from the primary core (if the two patterns match, the test may continue). The secondary cores may send a first response to the primary core through the control page indicating whether the patterns have successfully matched (i.e., a test pass or a test fail).

If any of the secondary cores do not indicate that a successful pattern match has been achieved, then the primary core may consider this a test fail and log a fatal fault via the system health monitor. When all expected secondary cores have responded with a test pass, the primary core may then write a third data pattern to its locked L1 cache line, followed by a data cache flush to push the update out to the data page in system memory. The primary core may pass a second update notification and a third data pattern to the secondary cores via the control page. When the second update notification is received from the primary core, the secondary cores may read a fourth pattern from their locked L1 cache line (which will be reloaded through the L2 cache line with the updated contents of the first data page in system memory). The secondary cores may determine a test pass or a test fail by comparing the fourth pattern read from its L1 cache line with the third pattern received from the primary core (if the two patterns match, the result is a test pass). The secondary cores may send a second response to the primary core through the control page indicating the determined test pass or test fail.

When all expected secondary cores have responded with a test result, the primary core may determine the overall test result by evaluating the individual test results from each of the secondary cores. If all individual test results indicate a test pass, then the primary core updates the core statuses in the control page. The primary core may switch its own core status to secondary core status, and switch the next secondary core to primary core status in round robin order. The test process then repeats with the new set of primary and secondary cores. If the primary core determines that a test fail has occurred (i.e. not all secondary cores indicated a test pass), then a fatal fault is logged via the system health monitor.

In a further aspect, the inventive concepts disclosed herein are directed to a method for verifying cache coherency in a multi-core processor (MCP) including one or more processor cores. In one embodiment, the method may comprise a setup phase including: designating, via the MCP, a first processor core of the one or more processor cores as a primary core and at least one second processor core of the one or more processor cores as a secondary core; generating, via the primary core, a first mapping associated with a data page of a system memory; and generating, via the at least one secondary core, a second mapping associated with the data page. The method may include locking, via the primary core, at least one first cache line of a first L1 cache associated with the primary core; locking at least one second cache line of a second L1 cache via the at least one secondary core, the at least one second L1 cache associated with the at least one secondary core; and locking at least one third cache line of an L2 cache via the primary core, the L2 cache shared by the one or more processor cores.

The method may comprise a testing cycle including: writing a first data pattern to the at least one first cache line via the primary core; performing a first flush of the at least one first cache line via the primary core; and passing a first update notification and the first data pattern from the primary core to the at least one secondary core via at least one control page of the system memory. The testing cycle may include, on receiving the first update notification and the first data pattern, reading a second data pattern from the at least one second cache line via the secondary core; determining, via the at least one secondary core, a test pass or a test fail by comparing the received first data pattern and the second data pattern (i.e., if the patterns match the result is a test pass). The testing cycle may include reporting, via the at least one secondary core, the test pass or test fail to the primary core and, if a test fail is reported, logging a fatal fault via a system health monitor (HM) of the MCP. The testing cycle may include writing a third data pattern to the at least one first cache line via the primary core; performing a second flush of the at least one first cache line via the primary core; passing a second update notification and the third data pattern from the primary core to the at least one secondary core via the control page. The testing cycle may include, on receiving the second update notification and the third data pattern, reading a fourth data pattern from the at least one second cache line via the at least one secondary core; determining, via the at least one secondary core, a test pass or test fail by comparing the received third data pattern and the fourth data pattern; and reporting, via the at least one secondary core, the test pass or test fail to the primary core. The method may include, if a test fail is reported to the primary core, logging a fatal fault via the system HM; and if no second test fail is reported, designating the primary core as a secondary core via the MCP and designating the next secondary core as a primary core.

BRIEF DESCRIPTION OF THE DRAWINGS

The inventive concepts disclosed herein may be better understood by those skilled in the art by reference to the accompanying figures in which:

FIGS. 3A, 3B, 3C, 3D, and 3E are process flow diagrams illustrating a method according to embodiments of the inventive concepts disclosed herein.

DETAILED DESCRIPTION

Features of the inventive concepts disclosed herein in their various embodiments are exemplified by the following descriptions with reference to the accompanying drawings, which describe the inventive concepts with further detail. It is to be understood that both the foregoing general description and the following detailed description are exemplary and explanatory only and are not necessarily restrictive of the inventive concepts disclosed and claimed herein. These drawings depict only exemplary embodiments of the inventive concepts, and should not be considered to limit their scope in any way.

Figure 1:
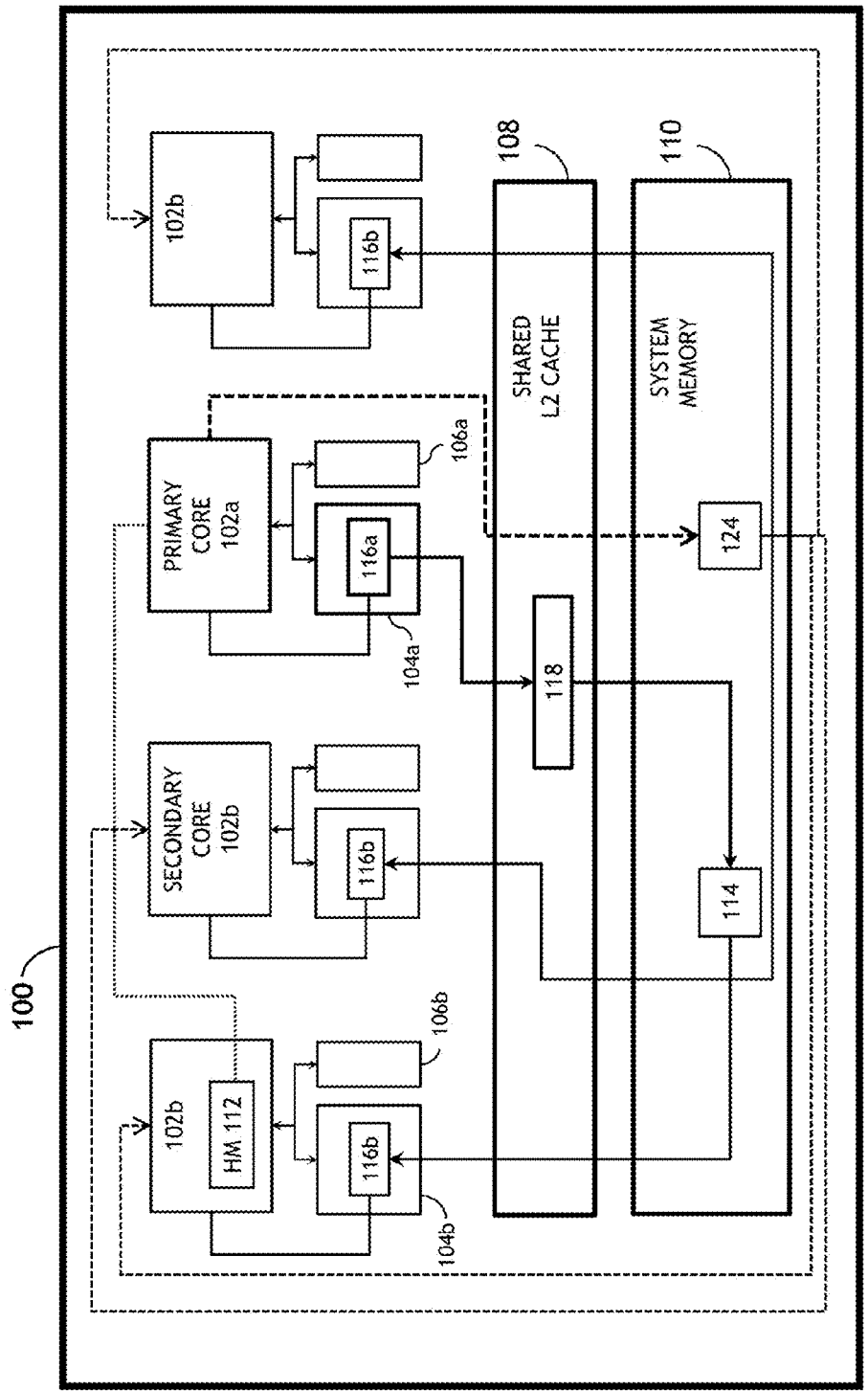
FIG. 1 is a block diagram of a processor system according to embodiments of the inventive concepts disclosed herein.

FIG. 1 illustrates a multi-core processor (MCP) 100 of a safety-critical avionics processing system according to embodiments of the inventive concepts disclosed herein. For example, the MCP 100 may include one or more processor cores 102. The processor cores 102 of the MCP 100 may be represented by processor partitions or by execution threads of a multi-threaded processor. Each processor core 102 may include a Level 1 (L1) cache specific to the processor core 102, the L1 cache including at least a data cache 104 and an instruction cache 106. The MCP 100 may include a Level 2 (L2) cache 108 shared by all processor cores 102. The MCP 100 may include physical addresses mapped to the system memory (ex.—system RAM) 110.

The MCP 100 may test cache coherency between any two L1 caches 104 of any two processor cores 102 of the MCP 100 by designating one processor core 102 as a primary core 102*a* (ex.—producer core) and the remaining processor cores 102 as secondary cores 102*b* (ex.—consumer cores). A processor core 102 designated by the MCP 100 as a primary core 102*a* may not necessarily correspond to a default processor core 102 in which the system health monitor (HM) 112 serving the MCP 100 is housed. The primary core 102*a* may prepare for the cache coherency test by creating a valid translation lookaside buffer (TLB) mapping (e.g., write-back, caching allowed) to a data page 114 of the system memory 110. Addresses comprising the data page 114 may be marked by the MCP 100 as "memory coherency required" for the purposes of the cache coherency test. The primary core 102*a* may also create a valid TLB mapping (write-back, cache inhibited) to a control page 124 in the system memory 110. Similarly, each secondary core 102*b* may create a similar set of valid TLB mappings to the data page 114 and to the control page 124. The primary core 102*a* may lock both an L1 cache line 116*a* in its own data cache 104*a* and an associated cache line 118 in the shared L2 cache 108. Each secondary core 102*b* may lock an L1 cache line 116*b* in its own data cache 104*b*, the L1 cache lines 116*b* associated with the cache line 118 in the shared L2 cache 108.

Figure 2A:
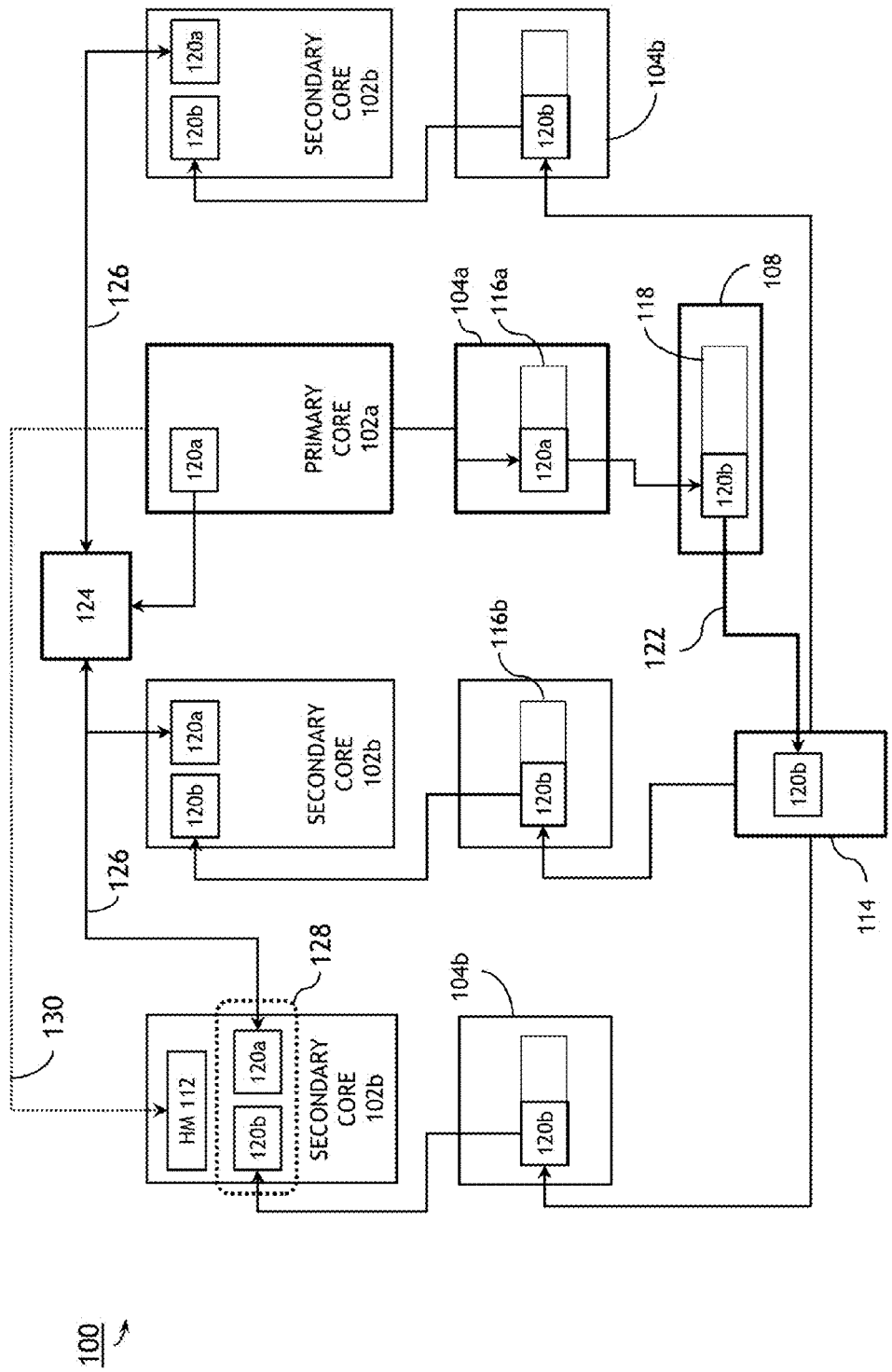
FIGS. 2A, 2B, 2C, and 2D are block diagrams of a cache coherency mechanism according to embodiments of the inventive concepts disclosed herein.

Once the data caches 104*a*, 104*b* of both the primary core 102*a* and secondary cores 102*b*, as well as the shared L2 cache 108, contain the required locked cache lines, the MCP 100 may initiate cache coherency testing by executing a setup phase. Referring also to FIG. 2A, the primary core 102*a* may update its locked L1 cache line 116*a* by writing a first test data pattern 120*a* to the L1 cache line 116*a*. For example, if the L1 cache line 116*a* is write-through and the shared L2 cache 108 is inclusive for all processor cores 102, the update to the L1 cache line 116*a* may result in an update to the L2 cache line 118 with the second test data pattern 120*b*. The primary core 102*a* may push the contents of the L2 cache line 118 (second test data pattern 120*b*) into the data page 114 by executing a cache flush (122) of its data cache line 116*a*. Assuming all L1 data caches 104 of the MCP 100 are coherent with respect to their shared L2 cache 108, the L1 cache lines 116*b* in the data caches 104*b* of each secondary core 102*b* may update via snoop hit, back invalidation and subsequent reloading with the contents of the data page 114 (second test data pattern 120*b*) upon next read by the secondary core 102*b*.

Referring also to FIG. 2A, when the primary core 102*a* has updated its locked L1 cache line 116*a*, the primary core 102*a* may notify each secondary core 102*b* of the cache update via a control page 124 of the system memory 110. The primary core 102*a* may send (126) the first test data pattern 120*a* to each secondary core 102*b* along with the cache update notification. On receiving the cache update notification and the first test data pattern 120*a* from the primary core 102*a*, each secondary core 102*b* may determine the result of the cache coherency test (ex.—test pass, test fail) by referencing its data cache 104*b* to read the coherently updated second test data pattern 120*b* from its locked L1 cache line 116*b* and compare (128) the coherently updated second test data pattern 120*b* with the first test data pattern 120*a* received from the primary core 102*a*. For example, the test result is a pass if the first test data pattern 120*a* matches the updated second test data pattern 120*b*. Each secondary core 102*b* may report its test results to the primary core 102*a* via the control page 124. If any secondary core 102*b* reports a test fail (i.e., the first test data pattern 120*a* and coherently updated second test data pattern 120*b* did not match), the primary core 102*a* may log a fatal fault (130) with the system HM 112 serving the MCP 100.

If all secondary cores 102*b* report a test pass, the setup phase concludes and the MCP continues coherency testing via the previously locked L1 cache lines 116 and shared L2 cache line 118. For example, referring to FIG. 2B, the primary core 102*a* may write a third test data pattern 120*c* to its locked L1 cache line 116*a*, notifying the secondary cores 102*b* of the cache update and sending (126) the third test data pattern 120*c* to each secondary core 102*b*. The primary core 102*a* may execute a second flush (122) of its data cache line 116*a*, pushing the contents of the L2 cache line (the fourth test data pattern 120*d*) into the data page 114. On receiving the cache update notification and third test data pattern 120*c*, each secondary core 102*b* may read the coherently updated fourth test data pattern 120*d* from its L1 cache line 116*b* and determine a test pass or test fail by comparing (128) the received third test data pattern 120*c* to the coherently updated fourth test data pattern 120*d*. Each secondary core 102*b* may report the test result to the primary core 102*a* via the control page 124; if any secondary core 102b reports a test fail, the primary core 102a may log a fatal fault (130) with the system HM 112.

Figure 2B:
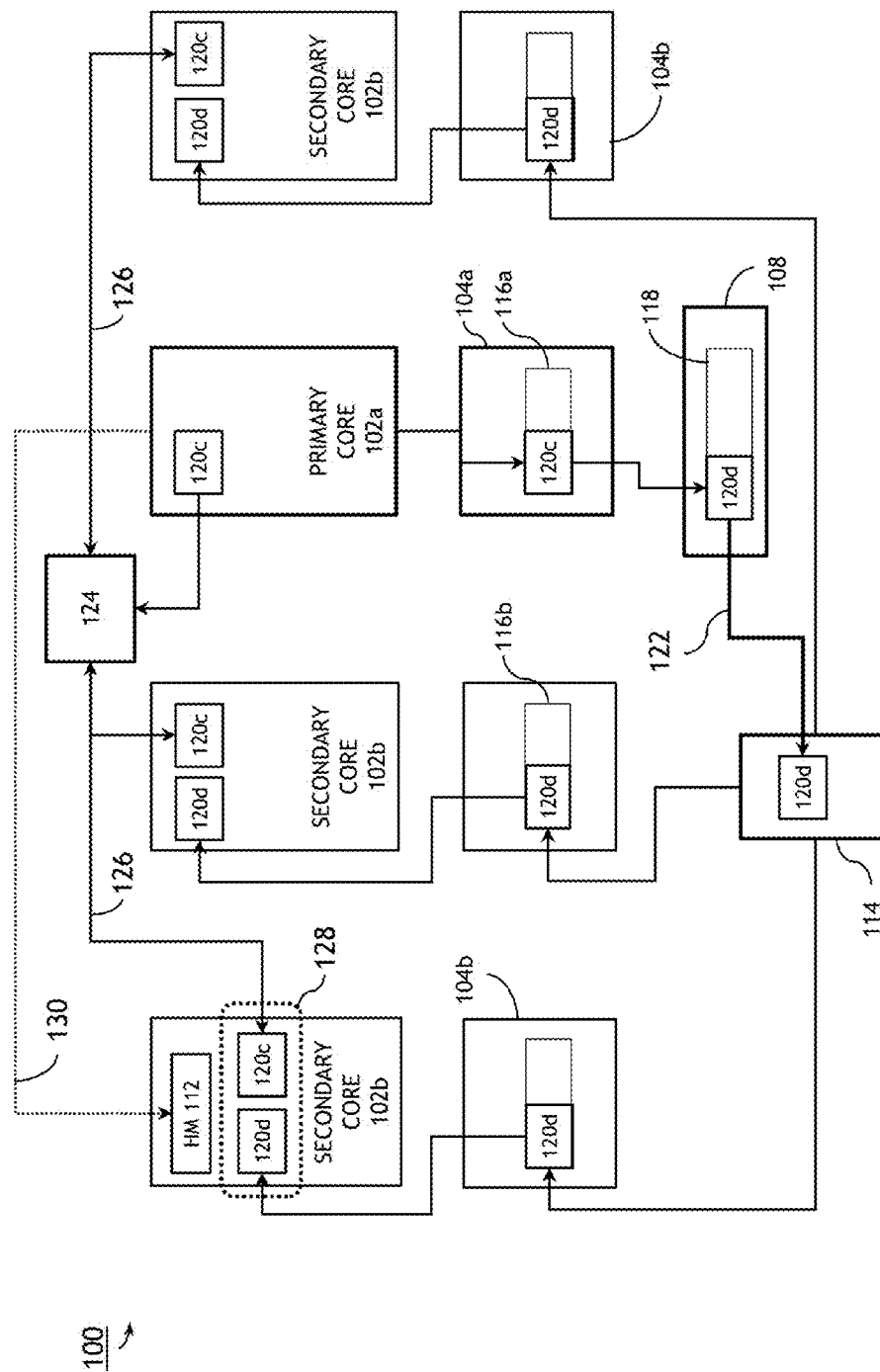
Figure 2C:
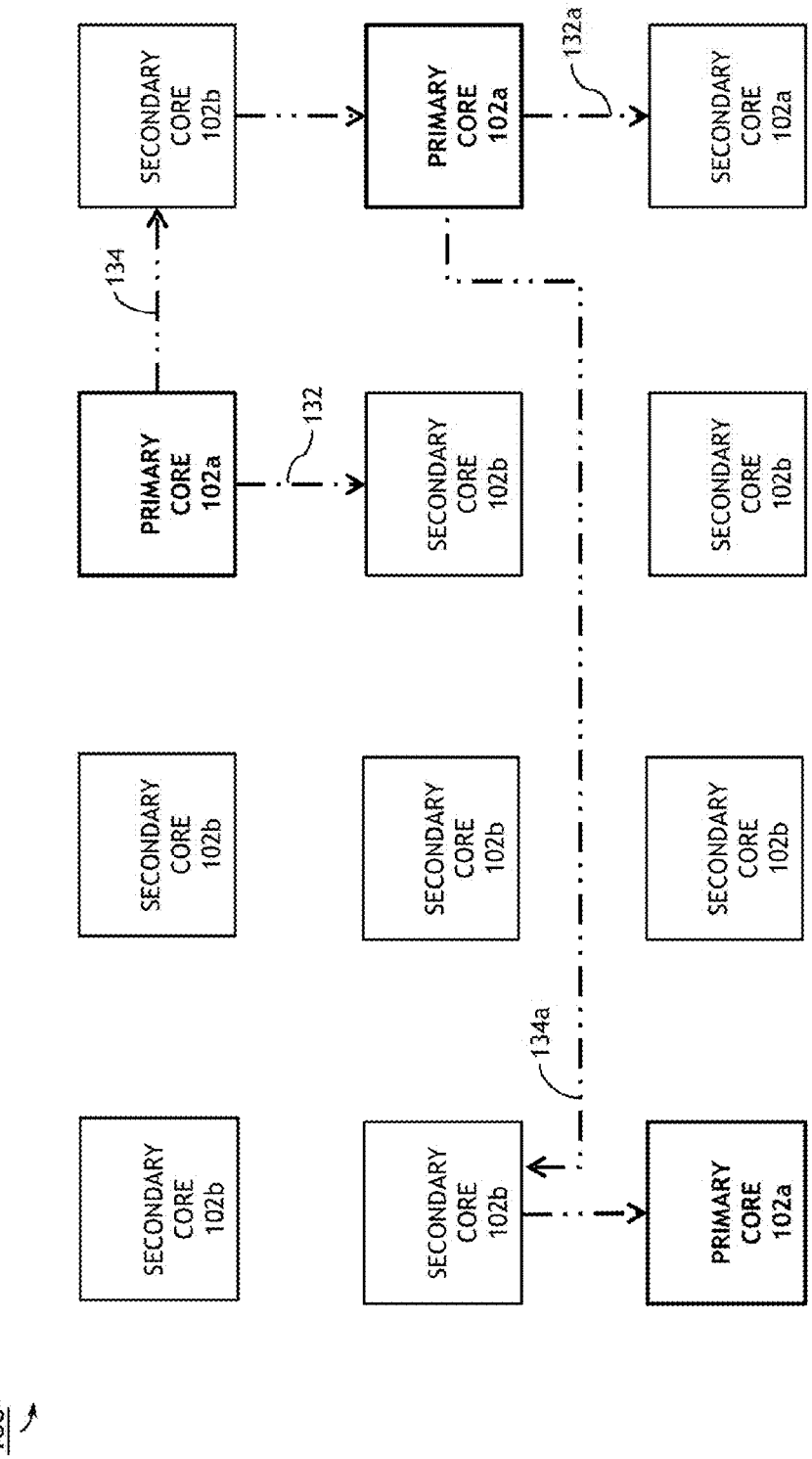

Otherwise, if all secondary cores 102b report a test pass to the primary core 102a, the primary core 102a may continue testing by updating the core status of each processor core 102. Referring to FIG. 2C, the current primary core 102a may update its own core status (132) to that of a secondary core 102b and update the core status (134) of a current secondary core 102b to that of a primary core 102a. For example, if the MCP 100 includes a sequence of N processor cores 102 (ex.—processor cores 1, 2, . . . N−1), where core M (0<M<N) is a primary core 102a, the primary core 102a may update its own core status to that of a secondary core 102b and update the status of core M+1 to that of a primary core 102a. If core N−1 is the current primary core 102a, the primary core 102a may update its own status (132a) to that of a secondary core 102b and update the status (134a) of core 1 to that of a primary core 102a. The new primary core 102a may continue cache coherency testing by repeating the above-outlined testing process (as shown by FIGS. 2A, 2B) with a new arrangement of primary core 102a and secondary cores 102b as shown by FIG. 2C.

Figure 2D:
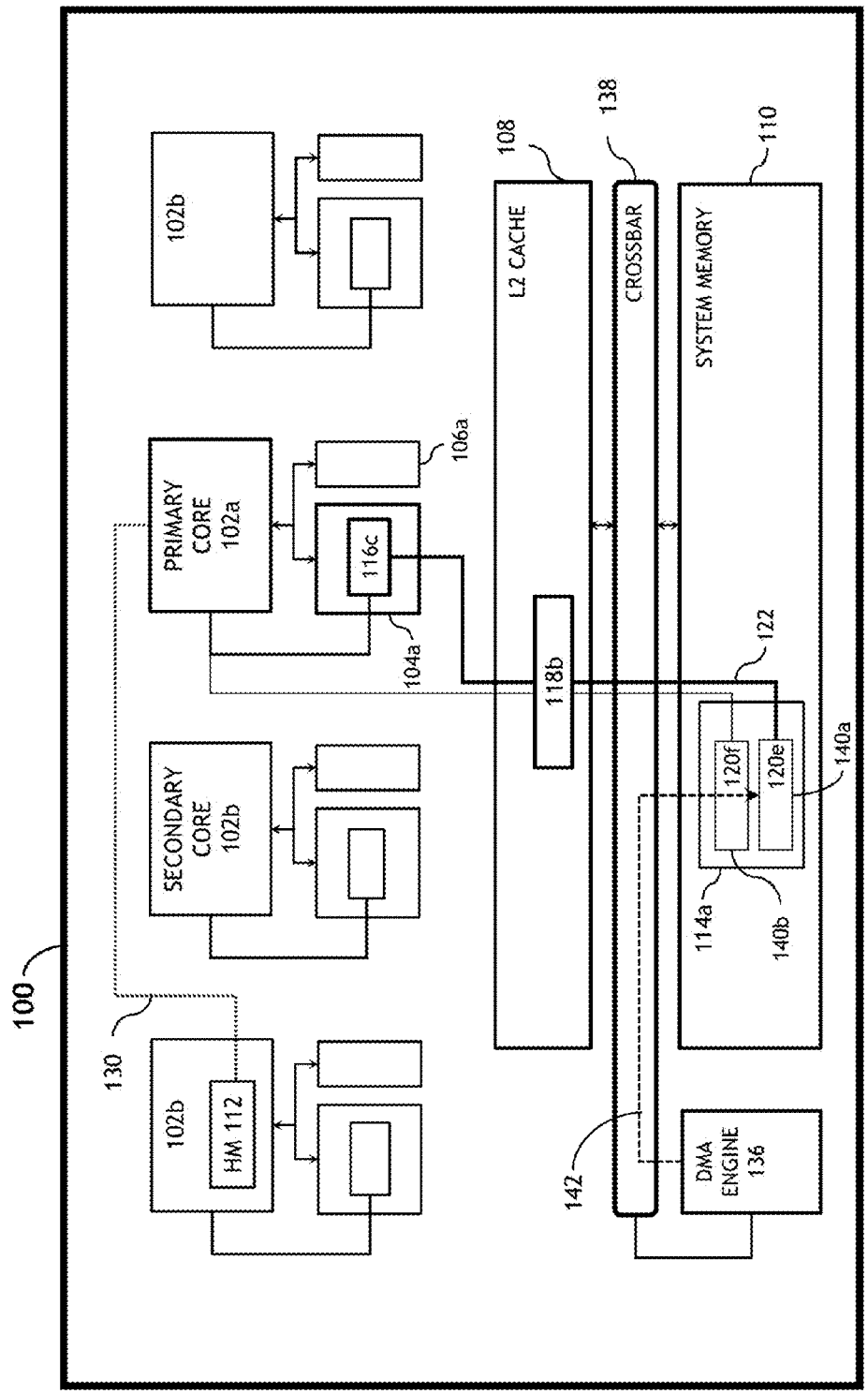

Referring to FIG. 2D, the MCP 100 may further verify cache coherency via one or more DMA engines 136 or other peripheral devices configured to directly access the system memory 110 via a crossbar 138 (ex.—crossbar switch, peripheral access management unit (PAMU)). Peripheral devices may include other controllers such as PCIe, Ethernet, USB, or SATA as well as other potential core clusters. For example, the primary core 102a may generate a new mapping using TLB entry values (ex.—write-back, cache enabled, coherency required) similar to those used for earlier phases of cache coherency testing. The new mapping by the primary core 102a may allocate a new data page 114a in the system memory 110. The primary core 102a may lock a new L1 cache line 116c in its data cache 104a as well as an L2 cache line 118b in the shared L2 cache 108, both locked cache lines associated with a first memory address 140a (ex.—memory location, physical address) of the system memory 110. The primary core 102a may write a fifth test data pattern 120e to its locked L1 cache line 116c. The locked L2 cache line 118b will update with the fifth test data pattern 120e, and the fifth test data pattern 120e may be pushed into the memory address 140a of the data page 114a via cache flush (122) of the L1 cache line 116c by the primary core 102a. The primary core 102a may write a sixth test data pattern 120f to a second memory address 140b of the data page 114a. The second memory address 140b may be elsewhere within the system memory 110 and outside the data page 114a, provided there is sufficient distance between the two memory addresses 140a, 140b. The primary core 102a may configure the DMA engine 136 (via the crossbar 138) to replace (142) the contents of the first memory address 140a (fifth test data pattern 120e) with the contents of the second memory address 140b (sixth test data pattern 120f). The primary core 102a may read the contents of the first memory address 140a and determine a test pass or test fail by comparing the contents of the first memory address 140a with the sixth test data pattern 120f. If the patterns do not match, the result is a test fail, and the primary core 102a may log a fatal fault (130) with the system HM 112 of the MCP 100. If the two patterns match, the result is a test pass. The primary core 102a may respond to a test pass by repeating a testing cycle whereby the primary core 102a writes the sixth test data pattern 120f (or a new data pattern, not shown) to the second memory address 140b and configures the DMA engine 136 to replace the contents of the first memory address 140a (which previously contained the sixth test data pattern 120f) with the contents of the second memory address 140b (which now contain the fifth test data pattern 120e). The primary core 102a may determine a test pass or test fail by comparing the contents of the first memory address 140a with the data pattern most recently written to the second memory address 140b (in this case, the fifth test data pattern 120e). If the two patterns match, the result is a test pass and the primary core 102a may continue testing. If the result is a test fail, the primary core 102a may log a fatal fault (130) with the system HM 112 of the MCP 100.

Figure 3B:
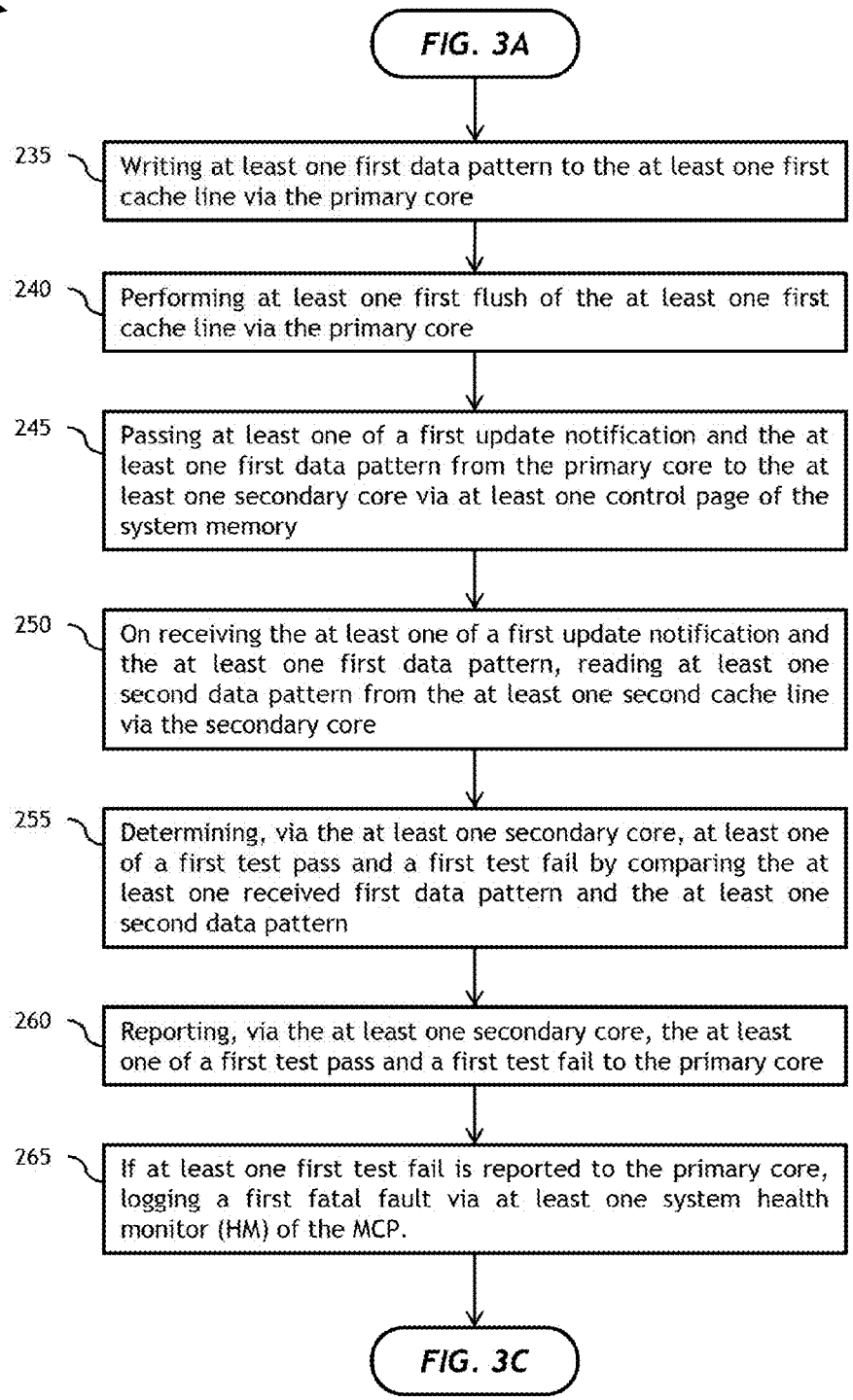

FIGS. 3A-3E illustrate a method 200 for verifying cache coherency in a multi-core processor (MCP) 100 including one or more processor cores 102 according to embodiments of the inventive concepts disclosed herein. Referring to FIG. 3A, at a step 205, the MCP 100 designates a first processor core 102 of the one or more processor cores as a primary core 102a and at least one second processor core 102 of the one or more processor cores as a secondary core 102b.

At a step 210, the primary core 102a generates at least one first mapping associated with at least one data page 114 of the system memory 110. For example, the at least one first mapping may be a first translation lookaside buffer (TLB) table entry.

At a step 215, the at least one secondary core 102b generates at least one second mapping associated with the at least one data page 114. For example, the at least one second mapping may be a second TLB table entry.

At a step 220, the primary core 102a locks at least one first cache line 116a of a first cache associated with the primary core 102a, the at least one first cache line 116a associated with the at least one data page 114. For example, the at least one first cache line 116a may be included in a first data cache 104a of a first L1 cache associated with the primary core 102a.

At a step 225, the at least one secondary core 102b locks at least one second cache line 116b of a second cache associated with the at least one secondary core 102b, the at least one second cache line 116b associated with the at least one data page 114. For example, the at least one second cache line 116b may be included in the second data cache 104b of at least one second L1 cache associated with the at least one secondary core 102b.

At a step 230, the primary core 102a locks at least one third cache line 118 associated with the at least one data page 114, the at least one third cache line 118 included in a third cache 108 shared by the one or more processor cores 102. For example, the third cache 108 may include a shared L2 cache 108.

Referring to FIG. 3B, at a step 235 the primary core 102a writes at least one first test data pattern 120a to the at least one first cache line 116a. For example, the L2 cache line 118 may update its contents to a second test data pattern 120b based on the write to the first cache line 116a.

At a step 240, the primary core 102a performs a first flush of the at least one first cache line 116a. For example, the primary core 102a may flush the at least one first cache line 116a, pushing the contents of the L2 cache line 118 (the second test data pattern 120b) into the data page 114.

At a step 245, the primary core 102a passes at least one of a first cache update notification and the at least one first test data pattern 120a to the at least one secondary core 102b via a control page 124 of the system memory 110.

At a step 250, on receiving the first cache update notification and the first test data pattern 120a, the at least one secondary core 102*b* reads the second test data pattern 120*b* from the at least one associated second L1 cache line 116*b*. The at least one associated second L1 cache line 116*b* may update its contents based on the contents of the data page 114 (the second test data pattern 120*b*).

At a step 255, the at least one secondary core 102*b* determines at least one of a first test pass and a first test fail by comparing the first test data pattern 120*a* received from the primary core 102*a* to the second test data pattern 120*b* read from the at least one associated second L1 cache line 116*b*.

At a step 260, the at least one secondary core 102*b* reports the first test pass or the first test fail to the primary core 102*a*.

At a step 265, if at least one first test fail is reported to the primary core 102*a*, the primary core 102*a* logs a first fatal fault (130) via the system HM 112 of the MCP 100.

The method 200 may include additional steps 270, 275, 280, 285, 290, 295, 300, and 305. Referring to FIG. 3C, at a step 270 the primary core 102*a* writes at least one third test data pattern 120*c* to the at least one first cache line 116*a*. The shared L2 cache line 118 may update its contents with a fourth test data pattern 120*d*.

At a step 275, the primary core 102*a* performs a second flush of the at least one first cache line 116*a*. The flush of the at least one first cache line 116*a* may push the contents of the shared L2 cache line 118 (the fourth test data pattern 120*d*) into the data page 114 of the shared memory 110.

At a step 280, the primary core 102*a* passes a second cache update notification and the third test data pattern 120*c* to the at least one secondary core 102*b* via the control page 124 of the system memory 110.

At a step 285, on receiving the second cache update notification and the third test data pattern 120*c*, the at least one secondary core 102*b* reads the fourth test data pattern 120*d* from the at least one associated second L1 cache line 116*b*. The at least one associated second L1 cache line 116*b* may update its contents based on the contents of the data page 114 (the fourth test data pattern 120*d*).

At a step 290, the at least one secondary core 102*b* determines a second test pass or a second test fail by comparing the third test data pattern 120*c* received from the primary core 102*a* and the fourth test data pattern 120*d* read from the associated second L1 cache line 116*b*.

At a step 295, the at least one secondary core 102*b* reports the second test pass or the second test fail to the primary core 102*a*.

At a step 300, if at least one second test fail is reported to the primary core 102*a*, the primary core 102*a* logs a second fatal fault (130) via the system HM 112 of the MCP 100.

At a step 305, if no second test fail is reported to the primary core 102*a* (i.e., all secondary cores 102*b* report a second test pass), the primary core 102*a* changes its own core status (132) to that of a secondary core 102*b* and changes the core status (134) of a secondary core 102*b* to that of a primary core 102*a*.

Figure 3E:
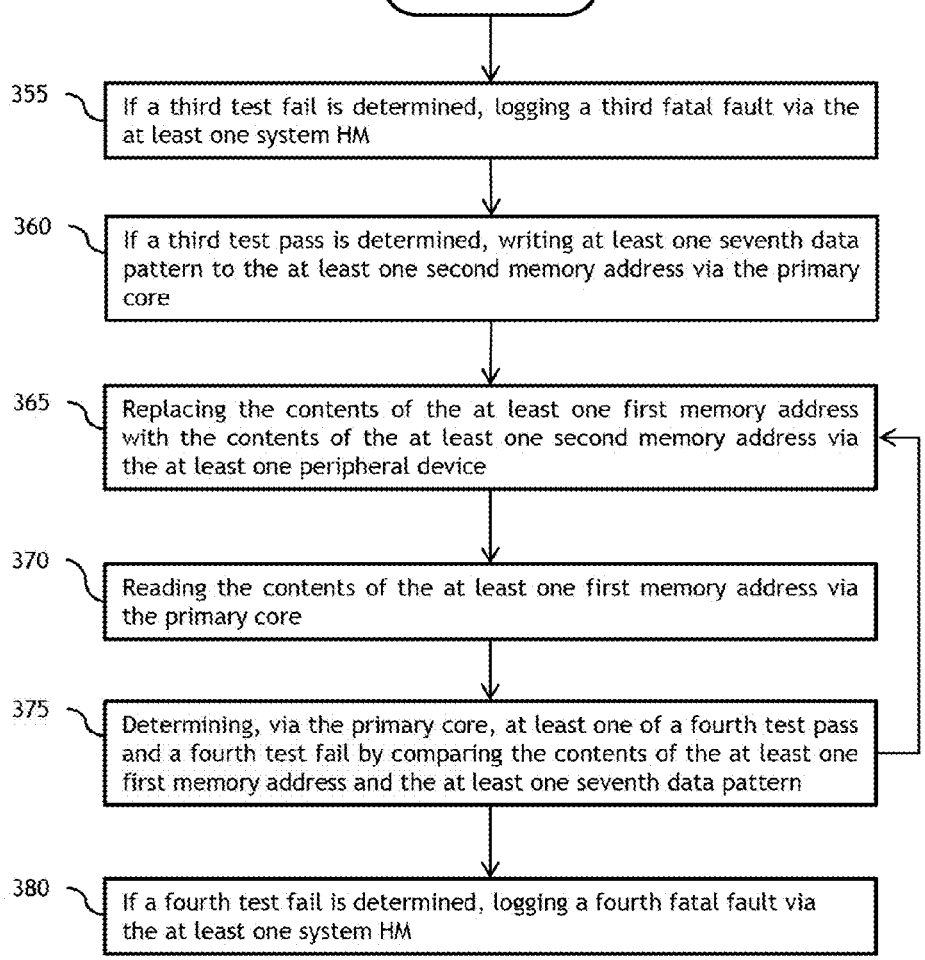

Referring to FIGS. 3D and 3E, the method 200 may include additional steps 310, 315, 320, 325, 330, 335, 340, 345, 350, 355, 360, 365, 370, 375, and 380. Referring to FIG. 3D, at a step 310 the primary core 102*a* generates at least one third mapping associated with a second data page 114*a* of the system memory 110, the second data page 114*a* including at least one first memory address 140*a* and at least one second memory address 140*b*. For example, the at least one third mapping may be a third TLB table entry.

At a step 315, the primary core 102*a* locks at least one fourth cache line 116*c* of the first cache. For example, the primary core 102*a* may lock at least one fourth cache line 116*c* of its data cache 104*a*.

At a step 320, the primary core 102*a* locks at least one fifth cache line 118*b* of the at least one third cache 108. For example, the primary core 102*a* may lock at least one fifth cache line 118*b* of the shared L2 cache 108.

At a step 325, the primary core 102*a* may write at least one fifth test data pattern 120*e* to the at least one fourth cache line 116*c*.

At a step 330, the primary core 102*a* may perform at least one third flush 122 of the at least one fourth cache line 116*c*.

At a step 335, the primary core 102*a* may write at least one sixth data pattern 120*f* to the at least one second memory address 140*b* of the second data page 114*a*. The at least one second memory address 140*b* may be outside the second data page 114*a* yet within the system memory 110.

At a step 340, the at least one peripheral device 136 may replace the contents of the at least one first memory address 140*a* with the contents of the at least one second memory address 140*b*. For example, the at least one peripheral device 136 may be a DMA engine, PCIe controller, Ethernet controller, USB controller, SATA controller, or core cluster configured by the primary core 102*a* via a crossbar 138 of the MCP 100.

At a step 345, the primary core 102*a* reads the contents of the at least one first memory address 140*a*.

At a step 350, the primary core 102*a* determines at least one of a third test pass and a third test fail by comparing the contents of the at least one first memory address 140*a* and the at least one sixth data pattern 120*f* written to the at least one second memory address 140*b*.

Referring to FIG. 3E, at a step 355, if a third test fail is determined, the primary core 102*a* logs a third fatal fault (130) via the at least one system HM 112 of the MCP 100.

At a step 360, if a third test pass is determined, the primary core 102*a* writes at least one seventh data pattern to the at least one second memory address 140*b*. For example, the primary core may write to the at least one second memory address 140*b* the fifth test data pattern 120*e* originally written to the first memory address 140*a*.

At a step 365, the at least one peripheral device 136 replaces the contents of the at least one first memory address 140*a* with the contents of the at least one second memory address 140*b*.

At a step 370, the primary core 102*a* may read the contents of the at least one first memory address 140*a*.

At a step 375, the primary core 102*a* determines at least one of a fourth test pass and a fourth test fail by comparing the contents of the at least one first memory address 140*a* and the at least one seventh data pattern. For example, the primary core 102*a* may compare the contents of the at least one first memory address 140*a* with the fifth test data pattern 120*e* previously written to the at least one second memory address 140*b*.

At a step 380, if a fourth test fail is determined, the primary core 102*a* logs a fourth fatal fault (130) via the at least one system HM 112 of the MCP 100.

While particular aspects of the inventive concepts disclosed herein have been shown and described, it will be apparent to those skilled in the art that, based upon the teachings herein, changes and modifications may be made without departing from the scope of the inventive concepts disclosed herein and their broader aspects and, therefore, the appended claims are to encompass within their scope all such changes and modifications as are within the broad scope of the inventive concepts disclosed herein.

We claim:

1. A processor system comprising:
   at least one system health monitor (HM);
   a multi-core processor (MCP) including one or more processor cores, each processor core having a core status, the MCP configured to designate the core status of a first processor core as a primary core, and to designate the core status of at least one second processor core as a secondary core;
   a first cache coupled to the first processor core;
   at least one second cache coupled to the at least one second processor core;
   at least one third cache couplable to the MCP;
   at least one system memory couplable to the MCP, the at least one system memory including at least one first data page and at least one control page, the at least one first data page including at least one first memory address and the at least one control page including at least one second memory address;
   the primary core configured to
      (a) generate at least one first mapping associated with the at least one first data page;
      (b) lock at least one first cache line of the first cache;
      (c) lock at least one second cache line of the at least one third cache, the at least one first cache line and the at least one second cache line associated with the at least one first data page;
      (d) write at least one first data pattern to the at least one first cache line;
      (e) perform a first flush of the at least one first cache line;
      (f) pass at least one of a first update notification and the at least one first data pattern to the at least one secondary core via the at least one control page; and
      (g) if at least one first test fail is received from a secondary core, log at least one first fatal fault via the at least one system HM;
   the at least one secondary core configured to
      (a) generate at least one second mapping associated with the at least one first data page;
      (b) lock at least one third cache line of the at least one second cache, the at least one third cache line associated with the at least one first data page;
      (c) on receiving the at least one of a first update notification and the at least one first data pattern, read at least one second data pattern from the at least one third cache line;
      (d) determine at least one of a first test pass and a first test fail by comparing the at least one first data pattern and the at least one second data pattern; and
      (e) report the at least one of a first test pass and a first test fail to the primary core via the at least one control page.

2. The processor system of claim 1, wherein at least one of the first mapping and the second mapping includes a translation lookaside buffer (TLB) table entry.

3. The processor system of claim 1, wherein the at least one third cache includes a shared Level 2 (L2) cache.

4. The processor system of claim 1, wherein:
   the primary core is configured to
      (a) write at least one third data pattern to the at least one first cache line;
      (b) perform a second flush of the at least one first cache line;
      (c) pass at least one of a second update notification and the at least one third data pattern to the at least one secondary core via the at least one control page;
      (d) if at least one secondary core reports a second test fail, log at least one second fatal fault via the at least one system HM; and
      (d) if no secondary core reports a second test fail, update the one or more core statuses of the one or more processor cores by changing the core status of the first processor core to a secondary core and changing at least one core status from a secondary core to a primary core; and
   the at least one secondary core is configured to
      (a) on receiving the at least one of a second update notification and the at least one third data pattern, read at least one fourth data pattern from the at least one third cache line;
      (e) determine at least one of a second test pass and a second test fail by comparing the at least one third data pattern and the at least one fourth data pattern; and
      (f) report the at least one of a second test pass and a second test fail to the primary core via the at least one control page.

5. The processor system of claim 4, wherein:
   the first cache includes at least a first data cache and a first instruction cache, the first data cache including the at least one first cache line; and
   the at least one second cache includes at least a second data cache and a second instruction cache, the at least one second data cache including the at least one third cache line.

6. The processor system of claim 5, wherein:
   the at least one second cache line is configured to update based on contents of at least one first cache line; and
   the primary core is configured to push the contents of the at least one second cache line into the at least one first data page by performing at least one of a first flush of the at least one first data cache line and a second flush of the at least one first data cache line.

7. The processor system of claim 4, wherein the primary core is configured to:
   generate at least one third mapping associated with a second data page of the at least one system memory, the second data page including at least one third memory address and at least one fourth memory address;
   lock at least one fourth cache line of the first cache;
   lock at least one fifth cache line of the at least one third cache, the at least one fourth cache line and the at least one fifth cache line associated with the at least one third memory address;
   write at least one fifth data pattern to the at least one fourth cache line;
   perform a third flush of the at least one fourth cache line;
   write at least one sixth data pattern to the at least one fourth memory address;
   configure at least one peripheral device to replace contents of the at least one third memory address with the contents of the at least one fourth memory address, the at least one peripheral device couplable to the at least one system memory via at least one crossbar;
   read the contents of the at least one third memory address;
   determine at least one of a third test pass and a third test fail by comparing the contents of the at least one third memory address and the at least one sixth data pattern;
   log at least one third fatal fault via the at least one system HM;

write at least one seventh data pattern to the at least one fourth memory address;

configure the at least one peripheral device to replace the contents of the at least one third memory address with the contents of the at least one fourth memory address;

determine at least one of a fourth test pass and a fourth test fail by comparing the contents of the at least one third memory address and the at least one seventh data pattern; and log at least one fourth fatal fault via the at least one system HM.

8. The processor system of claim 7, wherein the at least one peripheral device includes at least one of a DMA engine, a PCIe controller, an Ethernet, a USB controller, a SATA controller, and a core cluster.

9. The processor system of claim 1, wherein the at least one third cache line is configured to update based on contents of the at least one second cache line when read by the at least one secondary core.

10. The processor system of claim 1, wherein the processor system is embodied in an ARINC 653 compliant avionics processor system.

11. The processor system of claim 1, wherein the MCP includes one or more multithreaded processor cores, each multithreaded processor core having at least one of a thread and an execution unit.

12. A method for verifying cache coherency in a multi-core processor (MCP) including one or more processor cores, the method comprising:

designating, via the MCP, a first processor core of the one or more processor cores as a primary core and at least one second processor core of the one or more processor cores as a secondary core;

generating, via the primary core, at least one first mapping associated with at least one first data page of a system memory;

generating, via the at least one secondary core, at least one second mapping associated with the at least one first data page;

locking, via the primary core, at least one first cache line of a first cache associated with the primary core, the at least one first cache line associated with the at least one first data page;

locking at least one second cache line of a second cache via the at least one secondary core, the at least one second cache line associated with the at least one first data page and the at least one second cache associated with the at least one secondary core;

locking, via the primary core, at least one third cache line associated with the at least one first data page, the at least one third cache shared by the one or more processor cores;

writing at least one first data pattern to the at least one first cache line via the primary core;

performing at least one first flush of the at least one first cache line via the primary core;

passing at least one of a first update notification and the at least one first data pattern from the primary core to the at least one secondary core via at least one control page of the system memory;

on receiving the at least one of a first update notification and the at least one first data pattern, reading at least one second data pattern from the at least one second cache line via the secondary core;

determining, via the at least one secondary core, at least one of a first test pass and a first test fail by comparing the at least one received first data pattern and the at least one second data pattern;

reporting, via the at least one secondary core, the at least one of a first test pass and a first test fail to the primary core; and if at least one first test fail is reported to the primary core, logging a first fatal fault via at least one system health monitor (HM) of the MCP.

13. The method of claim 12, wherein:

performing at least one first flush of the at least one first cache line via the primary core includes pushing contents of the at least one third cache line into the at least one first data page; and on receiving the at least one of a first update notification and the at least one first data pattern, reading at least one second data pattern from the at least one second cache line via the secondary core includes updating the at least one second cache line based on the contents of the at least one first data page.

14. The method of claim 12, wherein:

locking, via the primary core, at least one first cache line of a first cache associated with the primary core includes locking, via the primary core, at least one first cache line of a first data cache associated with the primary core; and locking at least one second cache line of a second cache via the at least one secondary core, the at least one second cache line associated with the at least one first data page and the at least one second cache associated with the at least one secondary core includes locking at least one second cache line of a second data cache via the at least one secondary core, the at least one second cache line associated with the at least one first data page and the at least one second data cache associated with the at least one secondary core.

15. The method of claim 12, further comprising:

writing at least one third data pattern to the at least one first cache line via the primary core;

performing at least one second flush of the at least one first cache line via the primary core;

passing at least one of a second update notification and the at least one third data pattern from the primary core to the at least one secondary core via the at least one control page;

on receiving the at least one of a second update notification and the at least one third data pattern, reading at least one fourth data pattern from the at least one second cache line via the at least one secondary core;

determining, via the at least one secondary core, at least one of a second test pass and a second test fail by comparing the at least one received third data pattern and the at least one fourth data pattern;

reporting, via the at least one secondary core, the at least one of a second test pass and a second test fail to the primary core;

if at least one second test fail is reported to the primary core, logging at least one second fatal fault via the system HM; and if no second test fail is reported to the primary core, a) designating the primary core as a secondary core via the MCP and b) designating one secondary core as a primary core via the MCP.

16. The method of claim 15, further comprising:

generating, via the primary core, at least one third mapping associated with a second data page of the system memory, the second data page including at least one first memory address and at least one second memory address;
locking at least one fourth cache line of the first cache via the primary core;
locking at least one fifth cache line of the at least one third cache, the at least one fourth cache line and the at least one fifth cache line associated with the at least one first memory address;
writing at least one fifth data pattern to the at least one fourth cache line via the primary core;
performing at least one third flush of the at least one fourth cache line via the primary core;
writing at least one sixth data pattern to the at least one second memory address via the primary core;
replacing contents of the at least one first memory address with the contents of the at least one second memory address via at least one peripheral device;
reading the contents of the at least one first memory address via the primary core;
determining, via the primary core, at least one of a third test pass and a third test fail by comparing the contents of the at least one first memory address and the at least one sixth data pattern;
if a third test fail is determined, logging a third fatal fault via the at least one system HM;
if a third test pass is determined, writing at least one seventh data pattern to the at least one second memory address via the primary core;
replacing the contents of the at least one first memory address with the contents of the at least one second memory address via the at least one peripheral device;
reading the contents of the at least one first memory address via the primary core;
determining, via the primary core, at least one of a fourth test pass and a fourth test fail by comparing the contents of the at least one first memory address and the at least one seventh data pattern; and
if a fourth test fail is determined, logging a fourth fatal fault via the at least one system HM.

17. The method of claim 16, wherein replacing the contents of the at least one first memory address with the contents of the at least one second memory address via the at least one peripheral device includes:
replacing the contents of the at least one first memory address with the contents of the at least one second memory address via at least one of a DMA engine, a PCIe controller, an Ethernet controller, a SATA controller, a USB controller, and a core cluster.

18. The method of claim 16, wherein performing at least one third flush of the at least one fourth cache line via the primary core includes:
updating the at least one fifth cache line based on the at least one fourth cache line; and
pushing the contents of the at least one fifth cache line into the at least one first memory address.

19. The method of claim 12, wherein:
generating, via the primary core, at least one first mapping associated with at least one first data page of a system memory includes generating, via the primary core, at least one first translation lookaside buffer (TLB) table entry associated with at least one data page of a system memory; and
generating, via the at least one secondary core, at least one second mapping associated with the at least one first data page includes generating, via the at least one secondary core, at least one second TLB table entry associated with the at least one first data page.

20. The method of claim 12, wherein if no second test fail is reported to the primary core, a) designating the primary core as a secondary core via the MCP and b) designating one secondary core as a primary core via the MCP includes:
if no second test fail is reported to the primary core, a) designating the first processor core as a secondary core via the MCP and b) designating a second processor core adjacent to the first processor core as a primary core via the MCP.

* * * * *